United States Patent [19]

Juengling

[11] Patent Number: 5,670,412
[45] Date of Patent: Sep. 23, 1997

[54] SEMICONDUCTOR PROCESSING METHODS OF FORMING FIELD OXIDATION REGIONS ON A SEMICONDUCTOR SUBSTRATE

[75] Inventor: Werner Juengling, Boise, Id.

[73] Assignee: Micron Technology, Inc., Boise, Id.

[21] Appl. No.: 506,172

[22] Filed: Jul. 25, 1995

[51] Int. Cl.$^6$ .................................................. H01L 21/76
[52] U.S. Cl. ................... 437/69; 437/70; 437/72; 437/73
[58] Field of Search .................. 437/69, 70, 72, 437/73

[56] References Cited

U.S. PATENT DOCUMENTS

| | | | |
|---|---|---|---|
| 4,897,364 | 1/1990 | Nguyen et al. | 437/70 |
| 5,149,669 | 9/1992 | Hosaka | 437/72 |
| 5,196,367 | 3/1993 | Lu et al. | 437/70 |
| 5,248,350 | 9/1993 | Lee | 437/72 |
| 5,298,451 | 3/1994 | Rao | 437/70 |
| 5,326,715 | 7/1994 | Jang et al. | 437/72 |
| 5,358,890 | 10/1994 | Sivan et al. | 437/69 |
| 5,358,893 | 10/1994 | Yang et al. | 437/70 |
| 5,369,051 | 11/1994 | Rao et al. | 437/69 |
| 5,371,035 | 12/1994 | Pfiester et al. | 437/69 |
| 5,395,790 | 3/1995 | Lur | 437/73 |

FOREIGN PATENT DOCUMENTS

| | | | |
|---|---|---|---|
| 0161851 | 6/1989 | Japan | 437/72 |
| 2249867 | 5/1992 | United Kingdom | 437/69 |

*Primary Examiner*—Trung Dang
*Attorney, Agent, or Firm*—Wells, St. John, Roberts, Gregory & Matkin, P.S.

[57] ABSTRACT

A semiconductor processing method of forming field oxide regions includes, a) providing a sacrificial pad oxide layer over a semiconductor substrate; b) providing a $Ge_xSi_y$ layer over the pad oxide layer, where x is greater than 0.2, y is from 0 to 0.8, and x+y=1.0; c) providing a patterned nitride oxidation masking layer over the $Ge_xSi_y$ layer to define at least one pair of adjacent nitride masking blocks overlying desired active area regions of the substrate; d) etching exposed portions of the $Ge_xSi_y$ layer and thereby defining exposed sidewall edges of the $Ge_xSi_y$ layer; e) providing an oxidation restriction layer over the respective $Ge_xSi_y$ sidewalls, the oxidation restriction layer restricting rate of oxidation of the $Ge_xSi_y$ layer from what would otherwise occur if the oxidation restriction layer were not present; f) oxidizing portions of the substrate unmasked by the masking layer to form at least one pair of adjacent $SiO_2$ substrate field oxide regions; g) stripping the patterned masking layer from the substrate; h) after stripping the masking layer, stripping the $Ge_xSi_y$ layer or any oxidation product therefrom from the substrate selectively relative to $SiO_2$; and i) after stripping the $Ge_xSi_y$ layer or any oxidation product, stripping the pad oxide and any other oxide from the substrate between the pair of adjacent field oxide regions to outwardly expose substrate active area between the pair of field oxide regions. The invention also contemplates products produced by such method.

10 Claims, 10 Drawing Sheets

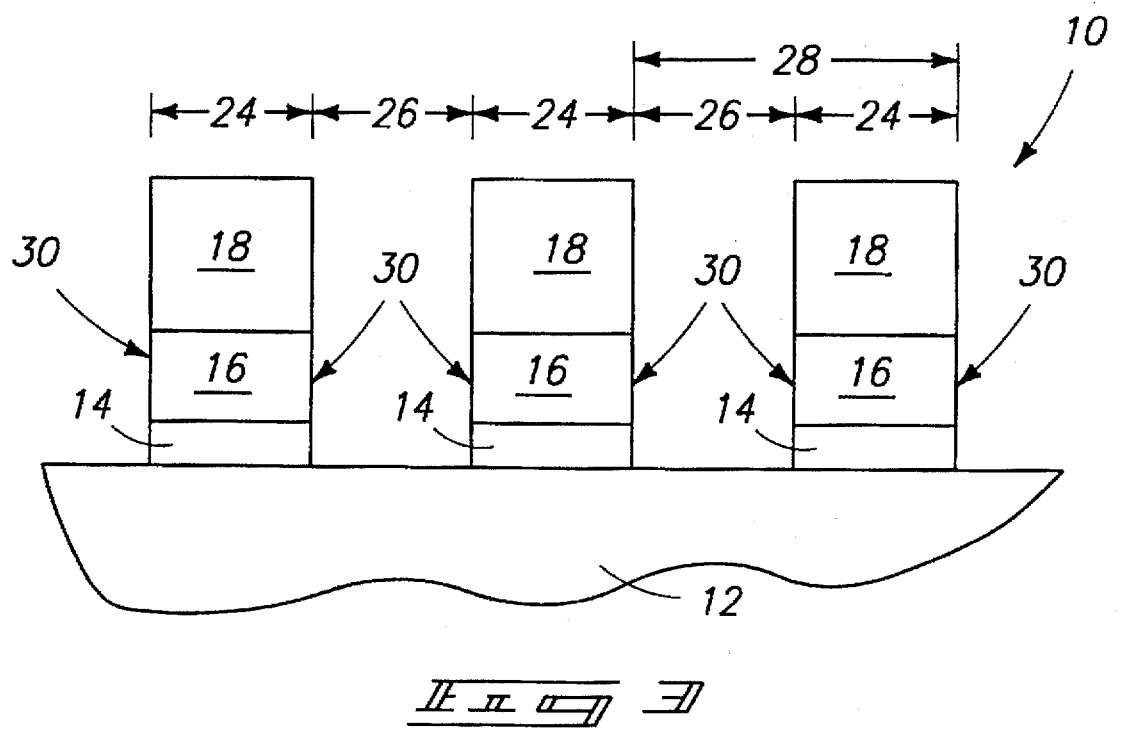
_Fig. 3_
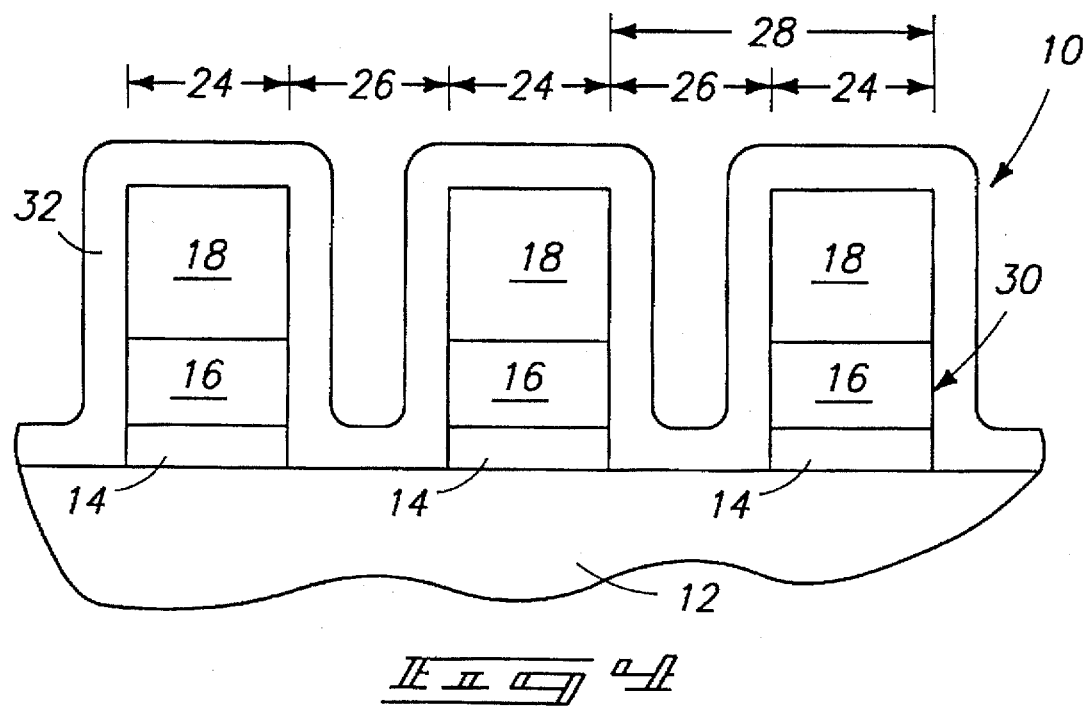
_Fig. 4_ ial 5,670,412

SEMICONDUCTOR PROCESSING METHODS OF FORMING FIELD OXIDATION REGIONS ON A SEMICONDUCTOR SUBSTRATE

TECHNICAL FIELD

This invention relates to semiconductor processing methods of forming field oxide regions on semiconductor substrates.

BACKGROUND OF THE INVENTION

The reduction in memory cell and other circuit size required for high density dynamic random access memories (DRAMs) and other circuitry is a continuing goal in semiconductor fabrication. Implementing electric circuits involves connecting isolated devices through specific electric paths. When fabricating silicon and other material into integrated circuits, it is necessary to isolate devices built into the substrate from one another. Electrical isolation of devices as circuit density increases is a continuing challenge.

One method of isolating devices involves the formation of a semi-recessed or fully recessed oxide in the nonactive (or field) area of the substrate. These regions are typically termed as "field oxide" and are formed by LOCal Oxidation of exposed Silicon, commonly known as LOCOS. One approach in forming such oxide is to cover the active regions with a thin layer of silicon nitride that prevents oxidation from occurring therebeneath. A thin intervening layer of a sacrificial pad oxide is provided intermediate the silicon substrate and nitride layer to alleviate stress and protect the substrate from damage during subsequent removal of the nitride layer. The unmasked or exposed field regions of the substrate are then subjected to a wet $H_2O$ oxidation, typically at atmospheric pressure and at temperatures of around 1000° C., for two to four hours. This results in field oxide growth where there is no masking nitride.

However at the edges of the nitride, some oxidant also diffuses laterally. This causes the oxide to grow under and lift the nitride edges. Because the shape of the oxide at the nitride edges is that of a slowly tapering oxide wedge that merges into another previously formed layer of oxide, it has commonly been referred to as a "bird's beak". The bird's beak is a lateral extension or encroachment of the field oxide into the active areas where the devices are formed. Although the length of the bird's beak depends upon a number of parameters, the length is typically 0.15 micron–0.5 micron per side.

This thinner area of oxide resulting from the bird's beak provides the disadvantage of not providing effective isolation in these regions, and as well unnecessarily consumes precious real estate on the semiconductor wafer. Further, as circuit density commonly referred to as device pitch falls below 1.0 micron, conventional LOCOS techniques fail due to excessive encroachment of the oxide beneath the masking stack. The closeness of the masking block stacks in such instances can result in effective joining of adjacent bird's beaks, thus effectively lifting the masking stacks and resulting in no masking effect to the oxidation.

Also, considerable undesirable stresses are created beneath the nitride at the silicon interface when oxidation occurs. These stresses are in large part due to the formed $SiO_2$ consuming 2.4 times the volume as elemental silicon it replaces. The pad oxide layer absorbs some of this stress, but additional techniques have been utilized. One such technique used to further alleviate the stress during LOCOS is to use a thin layer of polysilicon which is interposed between the pad oxide layer and the overlying nitride. The goal is to have some of the stress, which would otherwise be subjected upon the silicon substrate, occur in the deposited polysilicon layer. A significant problem, however, is that the polysilicon at the edges of the nitride mask will itself oxidize, forming $SiO_2$ which is the same composition as the field oxide regions. Such oxidized polysilicon regions are not practically removable, and undesirably result in increased volume of oxide in the bird's beak regions.

It would be desirable to develop alternate techniques.

BRIEF DESCRIPTION OF THE DRAWINGS

Preferred embodiments of the invention are described below with reference to the following accompanying drawings.

FIG. 3 is a view of the FIG. 1 wafer fragment at a processing step subsequent to that shown by FIG. 2.

FIG. 4 is a view of the FIG. 1 wafer fragment at a processing step subsequent to that shown by FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a pair of adjacent field oxide regions on a semiconductor substrate comprises the following steps:

providing a sacrificial pad oxide layer over a semiconductor substrate;

providing a layer of $Ge_xSi_y$ over the pad oxide layer, where x is greater than 0.2, y is from 0 to 0.8, and x+y=1.0;

providing a patterned nitride oxidation masking layer over the $Ge_xSi_y$ layer to define at least one pair of adjacent nitride masking blocks overlying desired active area regions of the substrate;

etching exposed portions of the $Ge_xSi_y$ layer and thereby defining exposed sidewall edges of the $Ge_xSi_y$ layer;

providing an oxidation restriction layer over the respective $Ge_xSi_y$ sidewalls, the oxidation restriction layer restricting rate of oxidation of the $Ge_xSi_y$ layer from what would otherwise occur if the oxidation restriction layer were not present;

oxidizing portions of the substrate unmasked by the masking layer to form at least one pair of adjacent $SiO_2$ field oxide regions on the substrate;

stripping the patterned masking layer from the substrate;

after stripping the masking layer, stripping the $Ge_xSi_y$ layer or any oxidation product therefrom from the substrate selectively relative to $SiO_2$; and after stripping the $Ge_xSi_y$ layer or any oxidation product therefrom, stripping the pad oxide and any other oxide from the substrate between the pair of adjacent field oxide regions to outwardly expose substrate active area between the pair of field oxide regions.

Figure 1:
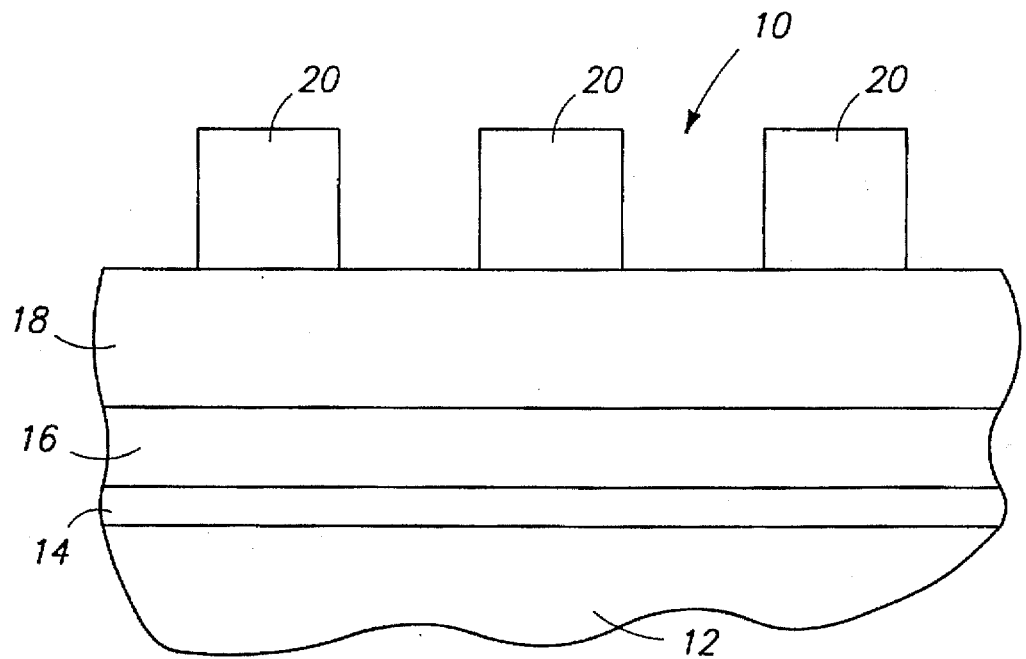
FIG. 1 is a diagrammatic sectional view of a semiconductor wafer fragment at one processing step in accordance with the invention.

More particularly with reference to the figures, FIG. 1 illustrates a semiconductor wafer fragment in process indicated generally with reference numeral 10. Such is comprised of a bulk semiconductor substrate 12, typically monocrystalline silicon. A sacrificial pad oxide layer 14 is provided over semiconductor substrate 12. An example and preferred thickness is from 50 Angstroms to 200 Angstroms. A layer 16 of $Ge_xSi_y$ is provided over pad oxide layer 14, where x is greater than 0.2, y is from 0 to 0.8, and x+y=1.0. An example preferred thickness for layer 16 is from 200 Angstroms to 800 Angstroms for 0.6 micron to 0.9 micron pitch density. Preferably, such layer comprises substantially 100% germanium, with y accordingly being equal to 0.

In processing steps described subsequently, it is highly desirable that remnants of layer 16, and any oxidation product thereof, be highly selectively etchable relative to oxide material produced by LOCOS. A maximum of 20 molar percent Si in a germanium-silicon alloy will provide the desired selectivity for wet acid etch chemistries.

A nitride oxidation masking layer 18 is provided over $Ge_xSi_y$ layer 16, with an example preferred thickness being from 1500 Angstroms to 2500 Angstroms. A patterned layer 20 of photoresist is provided outwardly of nitride layer 18.

Figure 2:
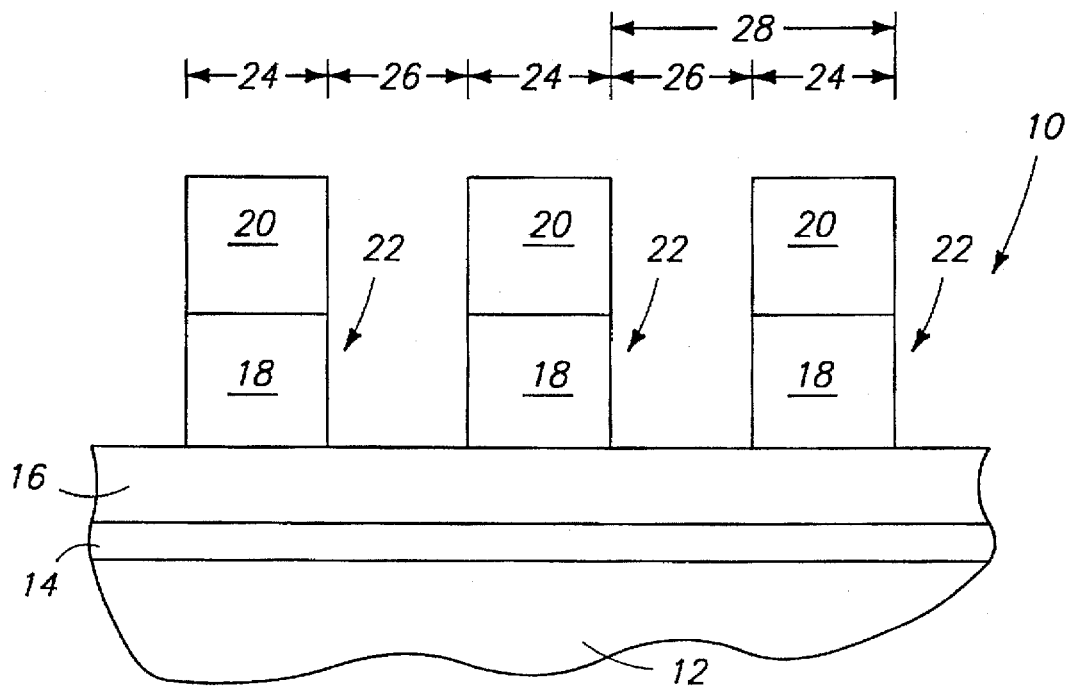
FIG. 2 is a view of the FIG. 1 wafer fragment at a processing step subsequent to that shown by FIG. 1.

Referring to FIG. 2, exposed portions of nitride layer 18 are etched to define nitride masking blocks 22 which effectively overlie or mask desired active area regions of substrate 12. As shown, regions 24 constitute desired masked active area regions, while regions 26 define area where field oxide will ultimately be provided. The invention is believed to have its greatest or most significant applicability where photoresist layer 20 is provided to produce nitride masking blocks 22 as having a separation pitch 28 of less than 1.0 micron.

Referring to FIG. 3, exposed portions of $Ge_xSi_y$ layer 16 are etched, thereby defining exposed sidewall edges 30 of $Ge_xSi_y$ layer 16. Exposed portions of pad oxide layer 14 are also preferably etched to outwardly expose silicon substrate 12 within areas 26.

Referring to FIG. 4, an oxidation restriction layer 32 is provided over the respective $Ge_xSi_y$ sidewalls 30. An example preferred deposition thickness for layer 32 is 200 Angstroms to 500 Angstroms. Layer 32 comprises a material which, and/or is deposited to an effective thickness to, restrict rate of oxidation of $Ge_xSi_y$ layer 16 from what would otherwise occur to layer 16 if oxidation restriction layer 32 were not present. Example and preferred materials include $SiO_2$ and polysilicon. Polysilicon is the more preferred.

Figure 5:
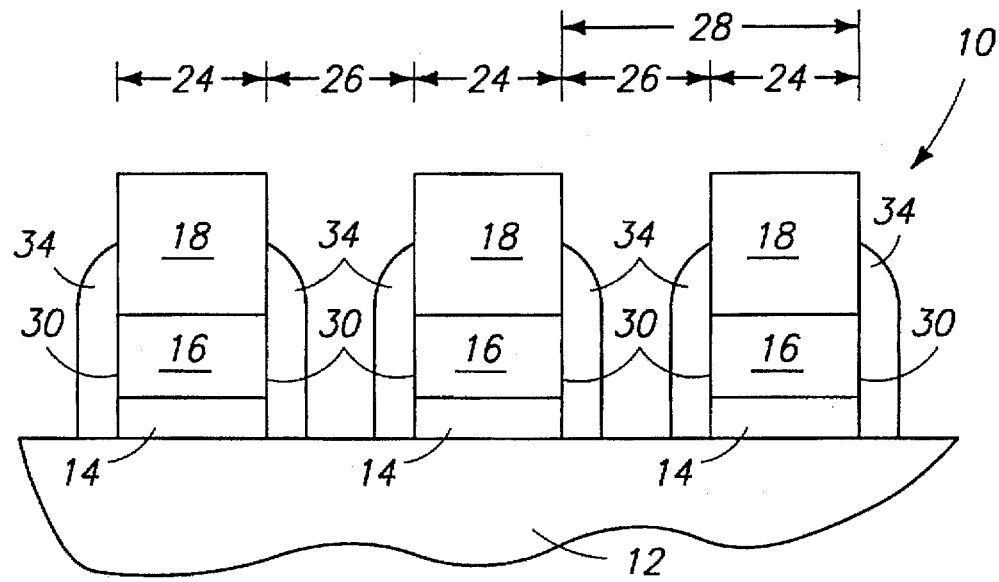
FIG. 5 is a view of the FIG. 1 wafer fragment at a processing step subsequent to that shown by FIG. 4.

Referring to FIG. 5, the deposited restriction layer 32 is anisotropically etched selectively relative to silicon substrate 12 to define sidewall spacers 34 overlying the respective $Ge_xSi_y$ sidewalls 30.

Figure 6:
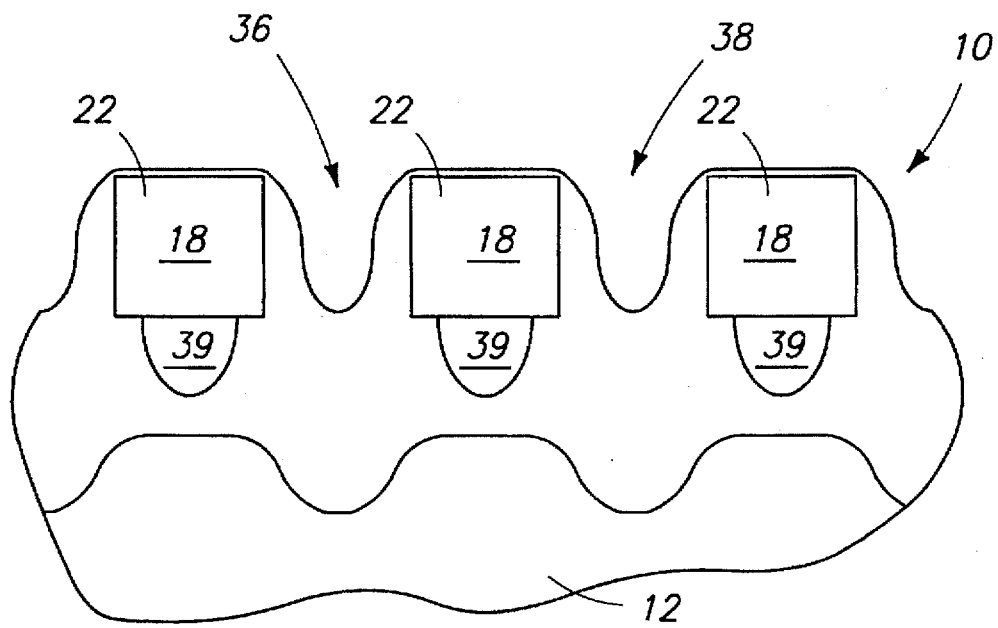
FIG. 6 is a view of the FIG. 1 wafer fragment at a processing step subsequent to that shown by FIG. 5.

Referring to FIG. 6, the wafer is subjected to oxidizing conditions effective to oxidize portions of substrate 12 which are unmasked by the masking material of layer 18 to form the illustrated pair of adjacent field oxide regions 36 and 38 on the substrate. Conventional or subsequently improved or developed LOCOS oxidation techniques can be utilized. Such oxidizing may or may not oxidize the $Ge_xSi_y$ layer to $Ge_xSi_yO_z$ material. Where oxidation occurs, the effect will be the illustrated lateral inward encroaching and elongation, producing the illustrated $Ge_xSi_yO_z$ oxide regions 39 from former $Ge_xSi_y$ layer 16. Depending upon the nature of the material of layer 32, its thickness, the length of dimension 24, and the oxidizing conditions, layer 16 may be un-oxidized or only partially oxidized.

Figure 7:
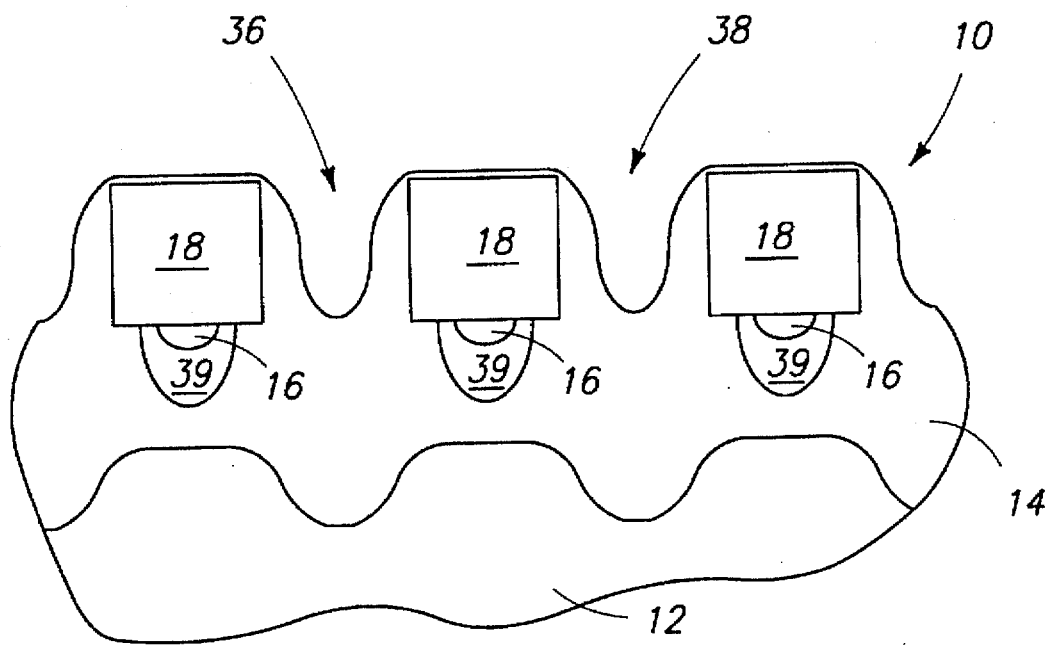
FIG. 7 is an alternate view of the FIG. 1 wafer fragment at an alternate FIG. 6 sequence processing step.

FIG. 7 illustrates an alternate example whereby remnants of un-oxidized layer 16 remain centrally located relative to surrounding $Ge_xSi_yO_z$ regions 39.

Figure 8:
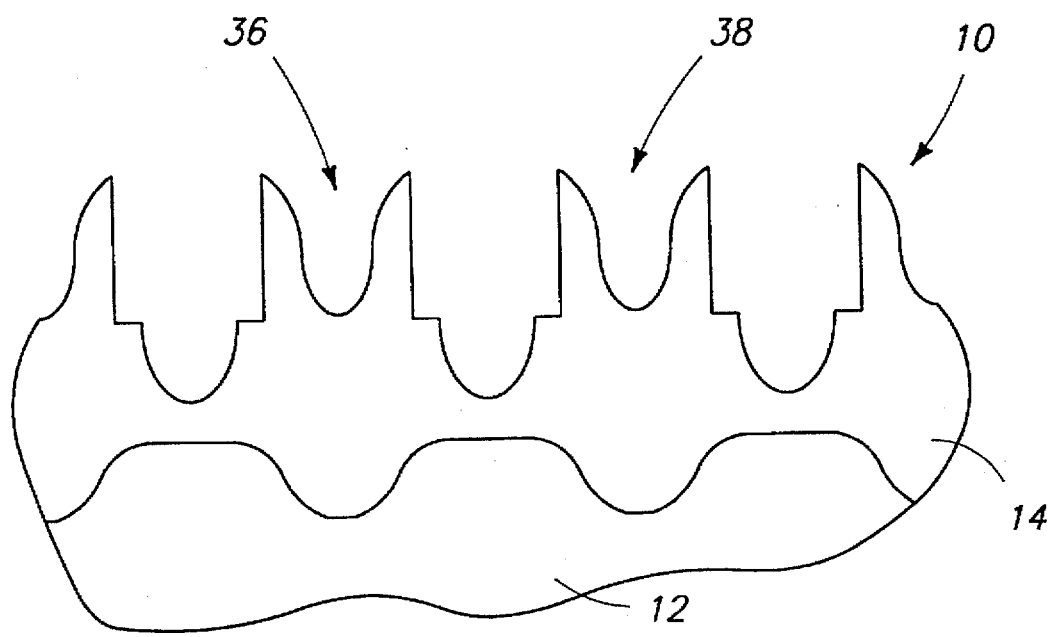
FIG. 8 is a view of the FIG. 1 wafer fragment at a processing step subsequent to that shown by FIG. 6 or FIG. 7.

Referring to FIG. 8, nitride material 18 of remaining nitride masking blocks 22 is stripped from the substrate. An example strip is a 155° C. $H_3PO_4$ wet etch, followed by a 100° C. $H_2O_2$ and $H_2SO_4$ etch to clean up the wafer. Layer 16 and any oxidation product therefrom will be etched by such example chemistry.

Figure 9:
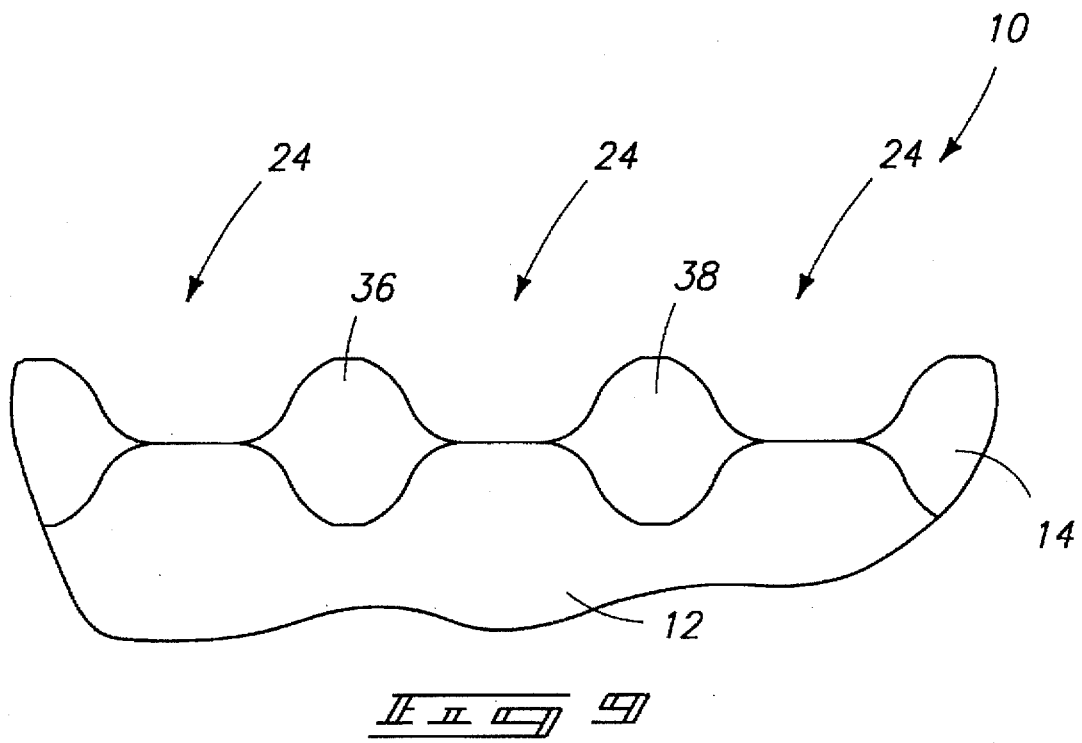
FIG. 9 is a view of the FIG. 1 wafer fragment at a processing step subsequent to that shown by FIG. 8.

Referring to FIG. 9, pad oxide and any other oxide is stripped from the substrate between the pair of adjacent field oxide regions to outwardly expose substrate active area 24 between field oxide regions 36 and 38. Typically, such would occur as a minimum by an initial pad oxide strip, subsequent reoxidation of the substrate to counter the Kooi effect, and a subsequent strip of the oxide produced from the reoxidation. Such results in removal of the illustrated projecting "ears" of FIG. 8, with the field oxide preferably taking on a FIG. 9-like profile.

Figure 10:
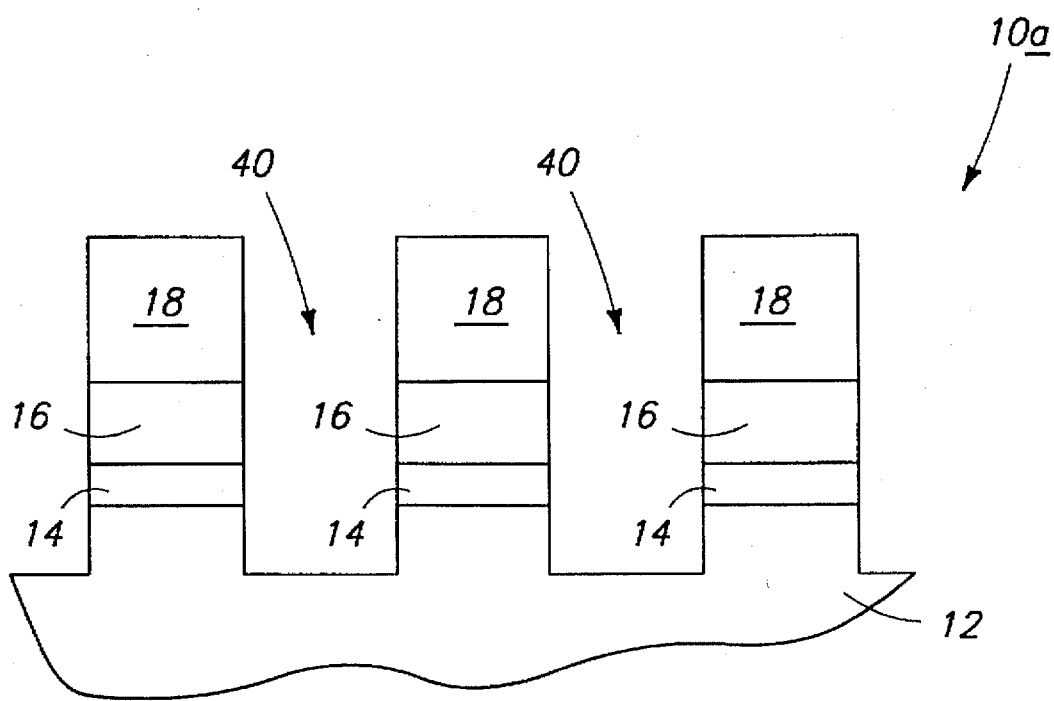
FIG. 10 is a diagrammatic sectional view of a semiconductor wafer fragment alternate to the FIGS. 1–9 embodiment, shown in sequence at an alternate processing step to that shown by FIG. 3.
Figure 12:
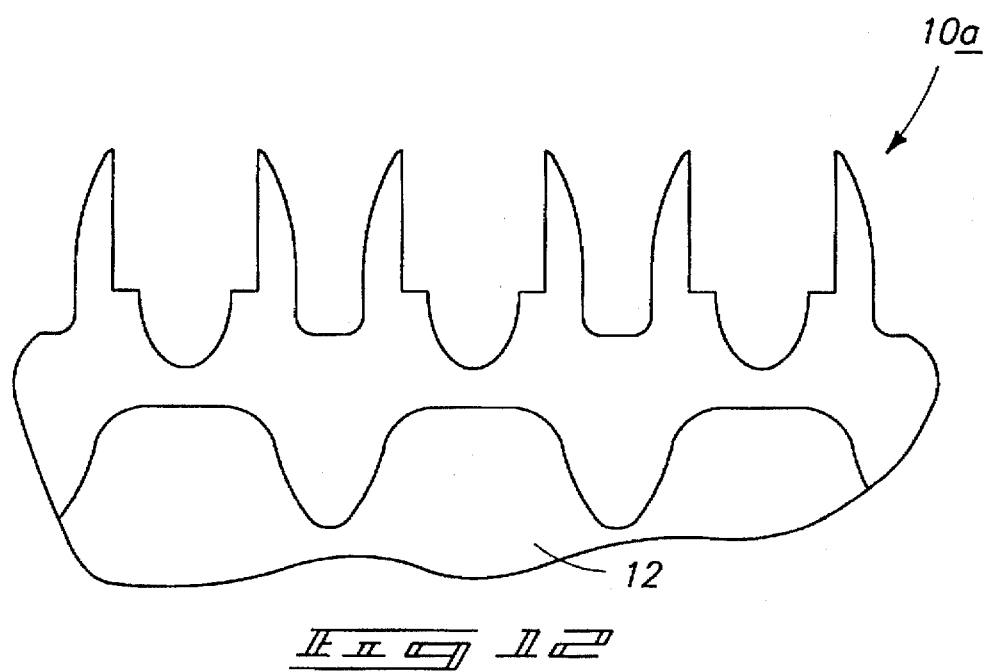
FIG. 12 is a view of the FIG. 10 wafer fragment at a processing step subsequent to that shown by FIG. 11.
Figure 13:
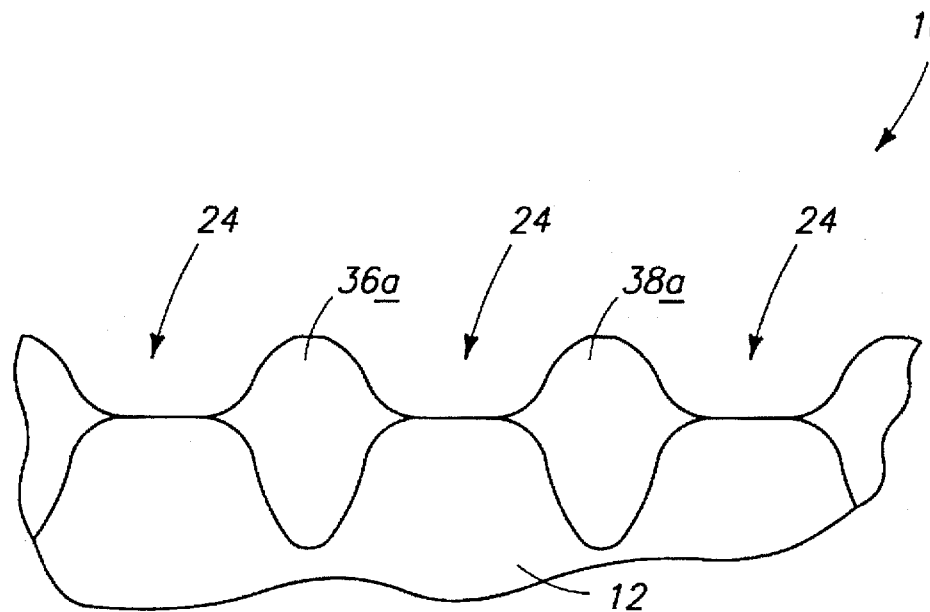
FIG. 13 is a view of the FIG. 10 wafer fragment at a processing step subsequent to that shown by FIG. 12.

An alternate embodiment is described with reference to FIGS. 10–13. Like numerals from the first described embodiment are utilized where appropriate, with differences of any significance being indicated by alternate numerals or with the suffix "a". FIG. 10 illustrates the FIG. 1 semiconductor wafer in process at an alternate, or immediately subsequent, step to that shown by FIG. 3. FIG. 10 shows substrate 12 having been etched into after etching through pad oxide layer 14 to form the illustrated substrate recesses 40. This will have the ultimate desired effect of substantially recessing the resultant field oxide regions relative to substrate 12 as depicted in FIGS. 11–13.

Figure 11:
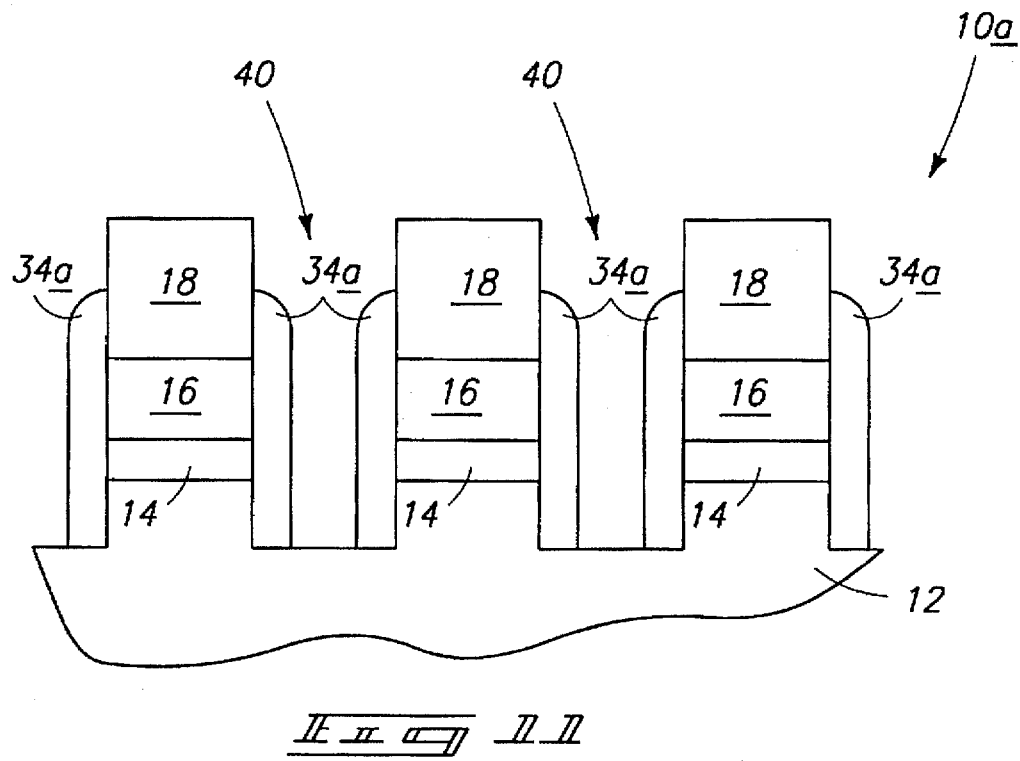
FIG. 11 is a view of the FIG. 10 wafer fragment at a processing step subsequent to that shown by FIG. 10.

Specifically, FIG. 11 shows elongated spacers 34a formed from the anisotropic etch. Spacers 34a accordingly also extend into and to the bases of recesses 40. FIG. 12 depicts subsequent oxidation and removal of the nitride of layer 18 and $Ge_xSi_y$ layer 16 and any oxidation product therefrom. FIG. 13 illustrates removal of oxide between field oxide regions 36a and 38a, with such regions effectively being substantially recessed relative to substrate 12.

Figure 14:
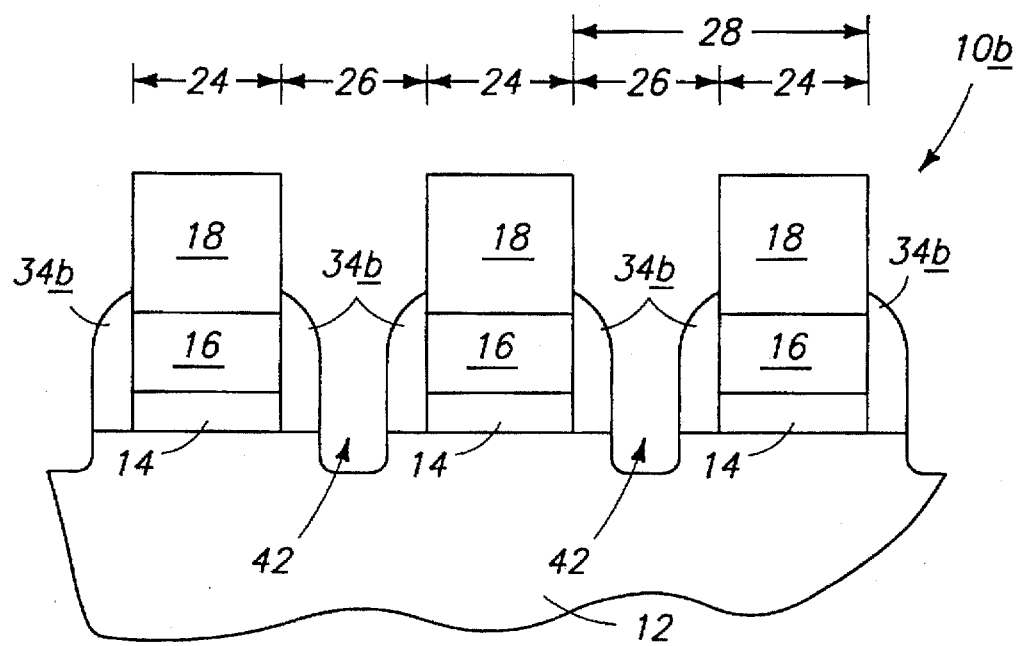
FIG. 14 is a diagrammatic sectional view of yet another alternate semiconductor wafer fragment embodiment, shown in sequence at an alternate processing step to that shown by FIG. 5.
Figure 15:
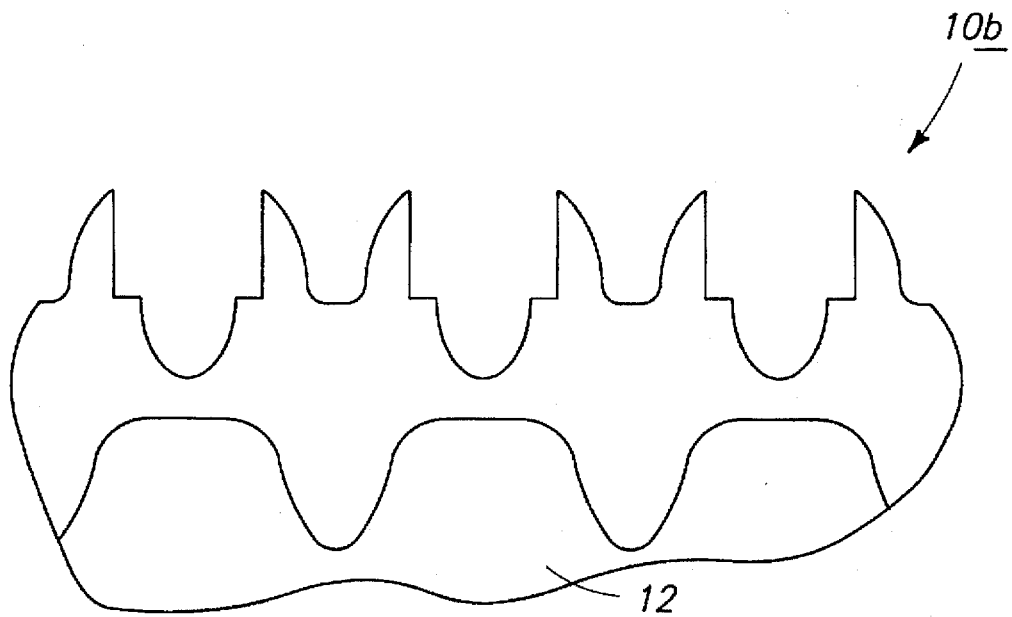
FIG. 15 is a view of the FIG. 14 wafer fragment at a processing step subsequent to that shown by FIG. 14.
Figure 16:
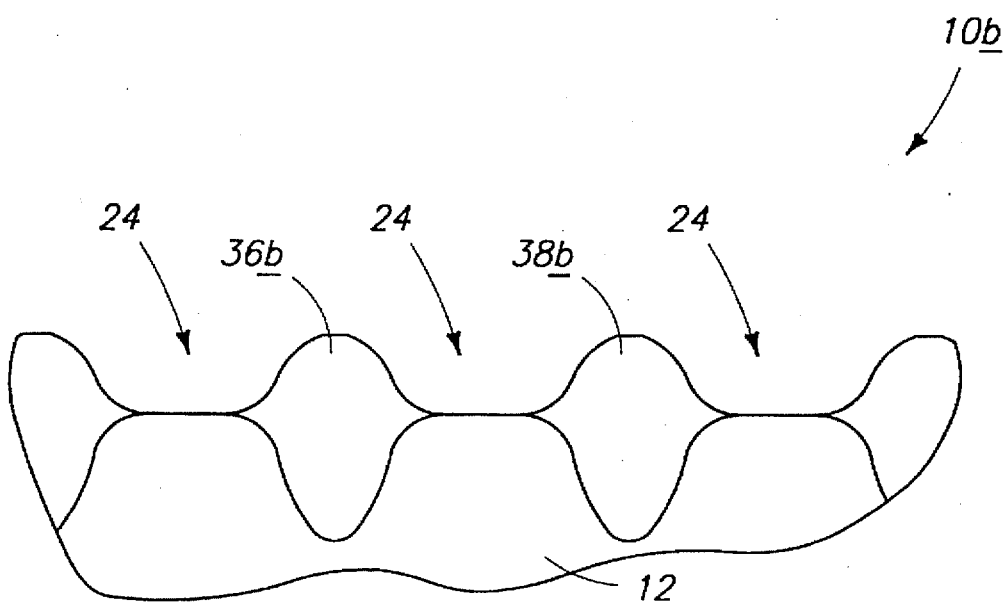
FIG. 16 is a view of the FIG. 14 wafer fragment at a processing step subsequent to that shown by FIG. 16.

FIGS. 14–16 illustrate still another alternate embodiment in accordance with the invention. Like numerals from the first described embodiment are utilized where appropriate, with differences of any significance being indicated by alternate numerals or with the suffix "b". FIG. 14 corresponds in sequence to FIG. 5 of the first embodiment, and illustrates the etch of layer 32 being further conducted to form recesses 42 into semiconductor substrate 12.

Where the material of layer 32 is polysilicon, such can be accomplished by over etching layer 32 such that etching into the silicon material of substrate 12 also inherently occurs. Such will have the effect of producing shorter sidewall spacers 34b, as shown. Where the material of layer 32 comprises $SiO_2$, a subsequent selective etch of the silicon of substrate 12 selectively relative to the oxide material layer 32 can be conducted, whereby the resultant sidewall spacers 34b will most typically be of the same relative dimensions as that depicted in FIG. 5.

FIGS. 15 and 16 illustrate subsequent processing steps which show an example resultant construction of field oxide regions 36b and 38b. The desired or preferred result is, again, to provide greater recessing of the resultant field oxide regions relative to substrate 12. Additionally in accordance with the invention, the methodical features of the FIGS. 10–13 and FIGS. 14–16 embodiments can be combined.

Figure 17:
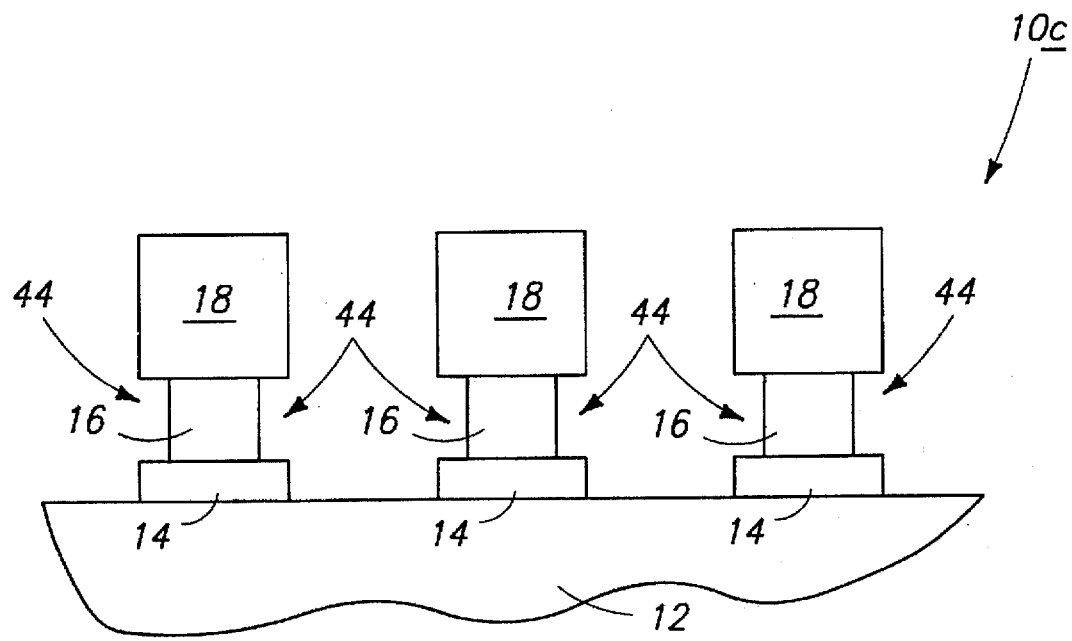
FIG. 17 is a diagrammatic sectional view of still another alternate semiconductor wafer fragment embodiment, shown in sequence at an another alternate processing step to that shown by FIG. 3.
Figure 18:
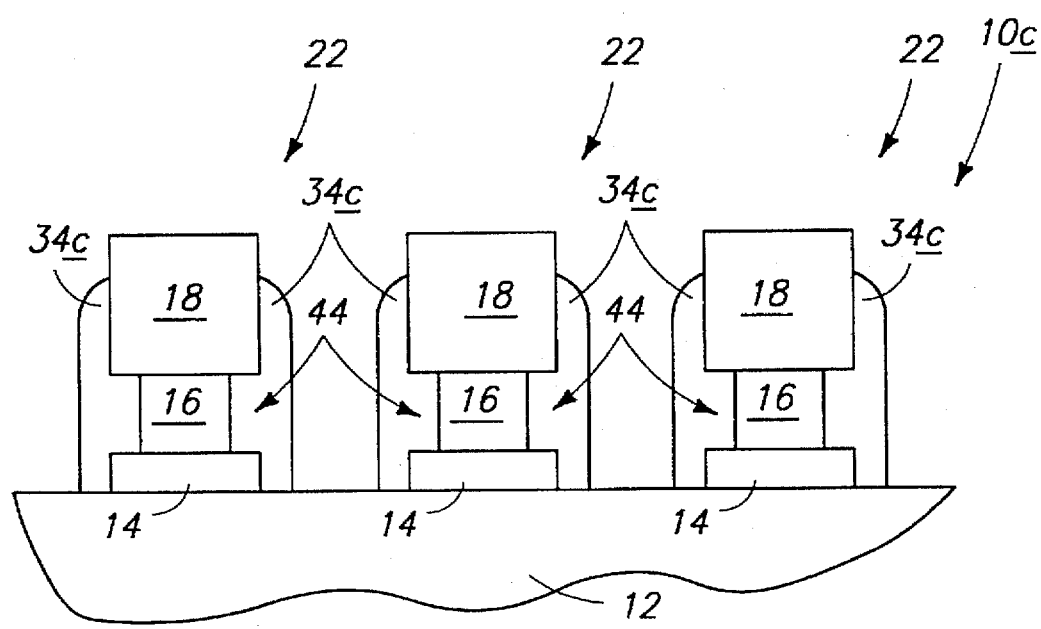
FIG. 18 is a view of the FIG. 17 wafer fragment at a processing step subsequent to that shown by FIG. 17
Figure 19:
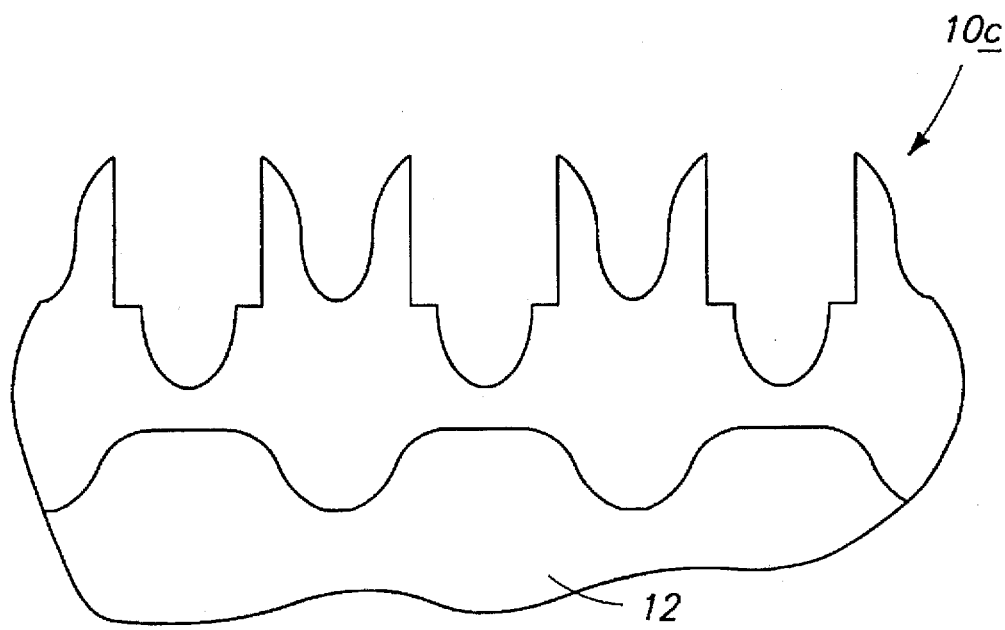
FIG. 19 is a view of the FIG. 17 wafer fragment at a processing step subsequent to that shown by FIG. 18.
Figure 20:
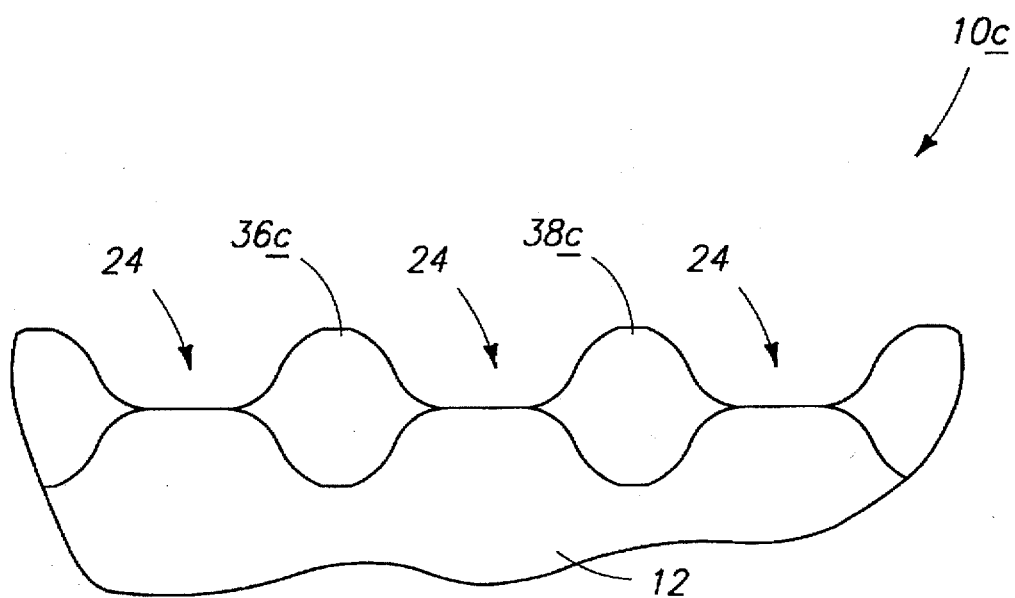
FIG. 20 is a view of the FIG. 17 wafer fragment at a processing step subsequent to that shown by FIG. 19.

FIGS. 17–20 depict yet another alternate embodiment processing method in accordance with the invention which can be conducted alone or in combination with the above sequences. Like numerals from the first described embodiment are utilized where appropriate, with differences of any significance being indicated by alternate numerals or with the suffix "c". FIG. 17 corresponds in processing sequence to FIG. 3 of the first described embodiment. Here, $Ge_xSi_y$ layer 16 is laterally etched into to form lateral recesses 44 within layer 16 relative to overlying nitride 18 and underlying pad oxide 14. FIGS. 18–20 illustrate the subsequent processing essentially in accordance with the above described embodiments. FIG. 18 shows spacers 34c, with FIG. 20 showing resulting field oxide regions 36c and 38c. This embodiment may result in further lateral encroachment of the field oxide regions relative to the desired active area regions 24. Accordingly in the context of maximized density, this particular embodiment is probably not preferred. It does, however, provide additional features to enable the processor to tailor the size and configuration of the field oxide regions if desired.

The invention also contemplates products produced by the above methods.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A semiconductor processing method of forming a pair of adjacent field oxide regions on a semiconductor substrate, the method comprising the following steps:

providing a sacrificial pad oxide layer over a semiconductor substrate;

providing a layer of Ge over the pad oxide layer;

providing a patterned nitride oxidation masking layer over the Ge layer to define at least one pair of adjacent nitride masking blocks overlying desired active area regions of the substrate;

etching exposed portions of the Ge layer and thereby defining exposed sidewall edges of the Ge layer;

providing an oxidation restriction layer over the respective Ge sidewalls, the oxidation restriction layer restricting rate of oxidation of the Ge layer from what would otherwise occur if the oxidation restriction layer were not present;

oxidizing portions of the substrate unmasked by the masking layer to form at least one pair of adjacent $SiO_2$ field oxide regions on the substrate;

stripping the patterned masking layer from the substrate;

after stripping the masking layer, stripping the Ge layer or any oxidation product therefrom from the substrate selectively relative to $SiO_2$; and after stripping the Ge layer or any oxidation product therefrom, stripping the pad oxide and any other oxide from the substrate between the pair of adjacent field oxide regions to outwardly expose substrate active area between the pair of field oxide regions.

2. A semiconductor processing method of forming a pair of adjacent field oxide regions on a semiconductor substrate, the method comprising the following steps:

providing a sacrificial pad oxide layer over a semiconductor substrate;

providing a layer of $Ge_xSi_y$ over the pad oxide layer, where x is greater than 0.2, y is from 0 to 0.8, and x+y=1.0;

providing a patterned nitride oxidation masking layer over the $Ge_xSi_y$ layer to define at least one pair of adjacent nitride masking blocks overlying desired active area regions of the substrate;

etching exposed portions of the $Ge_xSi_y$ layer inwardly to and through the pad oxide layer and thereby outwardly exposing the substrate and defining exposed sidewall edges of the $Ge_xSi_y$ layer;

after exposing the substrate and the sidewall edges of the $Ge_xSi_y$ layer, etching laterally into the $Ge_xSi_y$ layer to laterally recess the $Ge_xSi_y$ layer relative the masking nitride layer and the pad oxide layer;

providing an oxidation restriction layer over the respective $Ge_xSi_y$ sidewalls, the oxidation restriction layer restricting rate of oxidation of the $Ge_xSi_y$ layer from what would otherwise occur if the oxidation restriction layer were not present;

oxidizing portions of the substrate unmasked by the masking layer to form at least one pair of adjacent $SiO_2$ field oxide regions on the substrate;

stripping the patterned masking layer from the substrate;

after stripping the masking layer, stripping the $Ge_xSi_y$ layer or any oxidation product therefrom from the substrate selectively relative to $SiO_2$; and after stripping the $Ge_xSi_y$ layer or any oxidation product therefrom, stripping the pad oxide and any other oxide from the substrate between the pair of adjacent field oxide regions to outwardly expose substrate active area between the pair of field oxide regions.

3. The semiconductor processing method of claim 1 wherein the Ge layer is provided to a thickness of from 200 Angstroms to 800 Angstroms, and the nitride masking blocks have a separation pitch of less than 1 micron.

4. The semiconductor processing method of claim 2 wherein the Ge$_x$Si$_y$ layer is provided to a thickness of from 200 Angstroms to 800 Angstroms, and the nitride masking blocks have a separation pitch of less than 1 micron.

5. A semiconductor processing method of forming a pair of adjacent field oxide regions on a semiconductor substrate, the method comprising the following steps:

providing a sacrificial pad oxide layer over a semiconductor substrate;

providing a secondary buffering layer over the pad oxide layer;

providing a patterned nitride oxidation masking layer over the secondary buffering layer to define at least one pair of adjacent nitride masking blocks overlying desired active area regions of the substrate;

etching exposed portions of the secondary buffering layer inwardly to and through the pad oxide layer and thereby outwardly exposing the substrate and defining exposed sidewall edges of the secondary buffering layer;

after exposing the substrate and the sidewall edges of the secondary buffering layer, etching laterally into the secondary buffering layer to laterally recess the secondary buffering layer relative the masking nitride layer and the pad oxide layer;

providing an oxidation restriction layer over the respective secondary buffering layer sidewalls, the oxidation restriction layer restricting rate of oxidation of the secondary buffering layer from what would otherwise occur if the oxidation restriction layer were not present;

oxidizing portions of the substrate unmasked by the masking layer to form at least one pair of adjacent SiO$_2$ field oxide regions on the substrate;

stripping the patterned masking layer from the substrate;

after stripping the masking layer, stripping the secondary buffering layer or any oxidation product therefrom from the substrate selectively relative to SiO$_2$; and after stripping the secondary buffering layer or any oxidation product therefrom, stripping the pad oxide and any other oxide from the substrate between the pair of adjacent field oxide regions to outwardly expose substrate active area between the pair of field oxide regions.

6. A semiconductor processing method of forming a pair of adjacent field oxide regions on a semiconductor substrate comprising the following steps:

providing a pair of etched Ge layers over a substrate, individual Ge layers being provided between the substrate and respective adjacent nitride masking blocks overlying desired active area regions of the substrate, individual Ge layers having exposed sidewalls;

providing oxidation rate restricting layers over the Ge sidewalls;

oxidizing portions of the substrate unmasked by the nitride masking blocks to form at least one pair of adjacent SiO$_2$ field oxide regions on the substrate; and stripping the nitride masking blocks and the Ge layers or any oxidation product therefrom from the substrate between the pair of adjacent field oxide regions to outwardly expose substrate active area between the pair of field oxide regions.

7. A semiconductor processing method of forming a field oxide region on a semiconductor substrate comprising the following steps:

forming a Ge buffering layer intermediate a semiconductor substrate and an oxidation masking layer, the Ge and masking layers overlying a desired substrate area and leaving other substrate area exposed; and subjecting the substrate to oxidizing conditions effective to form at least one field oxide region in the exposed substrate area.

8. A semiconductor processing method of forming field oxide regions on a semiconductor substrate comprising:

interposing a Ge layer between a) a pad oxide layer overlying selected substrate areas, and b) an oxidation masking layer; and subjecting the substrate to oxidizing conditions effective to form field oxide regions adjacent the selected areas.

9. A semiconductor processing method of forming field oxide regions on a semiconductor substrate comprising the following steps:

forming a pair of etched Ge layers over a substrate, individual Ge layers being formed between the substrate and respective adjacent nitride masking blocks overlying desired active area regions of the substrate, individual Ge layers having exposed sidewalls;

forming oxidation rate restricting layers over the Ge sidewalls;

oxidizing portions of the substrate unmasked by the nitride masking blocks to form at least one pair of adjacent SiO$_2$ field oxide regions on the substrate; and stripping the nitride masking blocks and the Ge layers or any oxidation product therefrom from the substrate between the pair of adjacent field oxide regions to outwardly expose substrate active area between the pair of field oxide regions.

10. A semiconductor processing method of forming a pair of adjacent field oxide regions on a semiconductor substrate, the method comprising the following steps:

providing a sacrificial pad oxide layer over a semiconductor substrate;

providing a layer comprising Ge over the pad oxide layer;

providing a patterned nitride oxidation masking layer over the Ge layer to define at least one pair of adjacent nitride masking blocks overlying desired active area regions of the substrate;

etching exposed portions of the Ge layer inwardly to and through the pad oxide layer and thereby outwardly exposing the substrate and defining exposed sidewall edges of the Ge layer;

after exposing the substrate and the sidewall edges of the Ge layer, etching laterally into the Ge layer to laterally recess the Ge layer relative the masking nitride layer and the pad oxide layer;

providing an oxidation restriction layer over the respective Ge sidewalls, the oxidation restriction layer restricting rate of oxidation of the Ge layer from what would otherwise occur if the oxidation restriction layer were not present;

oxidizing portions of the substrate unmasked by the masking layer to form at least one pair of adjacent SiO$_2$ field oxide regions on the substrate;

stripping the patterned masking layer from the substrate;

after stripping the masking layer, stripping the Ge layer or any oxidation product therefrom from the substrate selectively relative to SiO$_2$; and after stripping the Ge layer or any oxidation product therefrom, stripping the pad oxide and any other oxide from the substrate between the pair of adjacent field oxide regions to outwardly expose substrate active area between the pair of field oxide regions.

* * * * *